(12) United States Patent
Kim

(10) Patent No.: US 11,895,855 B2
(45) Date of Patent: Feb. 6, 2024

(54) LIGHT-EMITTING DEVICE

(71) Applicant: Samsung Electronics Co., Ltd., Suwon-si (KR)

(72) Inventor: YongChurl Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 557 days.

(21) Appl. No.: 17/004,540

(22) Filed: Aug. 27, 2020

(65) Prior Publication Data

US 2021/0066635 A1  Mar. 4, 2021

(30) Foreign Application Priority Data

Aug. 29, 2019 (KR) .................. 10-2019-0106641
Jun. 9, 2020 (KR) .................. 10-2020-0069843

(51) Int. Cl.
| | |
|---|---|
| H01L 29/78 | (2006.01) |
| H10K 50/11 | (2023.01) |
| C07F 7/24 | (2006.01) |
| C09K 11/06 | (2006.01) |
| H10K 50/13 | (2023.01) |
| H10K 85/30 | (2023.01) |
| H10K 50/15 | (2023.01) |
| H10K 50/16 | (2023.01) |
| H10K 101/40 | (2023.01) |

(52) U.S. Cl.
CPC ............... *H10K 50/11* (2023.02); *C07F 7/24* (2013.01); *C09K 11/06* (2013.01); *H10K 50/131* (2023.02); *H10K 85/30* (2023.02); C09K 2211/10 (2013.01); C09K 2211/188 (2013.01); H10K 50/15 (2023.02); H10K 50/16 (2023.02); H10K 2101/40 (2023.02)

(58) Field of Classification Search
CPC ............ H01L 51/5004; H01L 51/0077; H01L 51/5044; H01L 51/5012; H01L 51/5056; H01L 51/5072; C07F 7/24; C09K 11/06; C09K 2211/10; C09K 2211/188
USPC ........................................................ 257/40
See application file for complete search history.

(56) References Cited

U.S. PATENT DOCUMENTS

| | | | |
|---|---|---|---|
| 2010/0176380 A1* | 7/2010 | Jung ................. | C07D 263/57 257/40 |
| 2011/0025199 A1* | 2/2011 | Park ................. | H10K 50/865 313/504 |
| 2011/0042697 A1* | 2/2011 | Lee ................. | H10K 50/854 257/89 |

(Continued)

FOREIGN PATENT DOCUMENTS

| | | |
|---|---|---|
| EP | 2942826 A2 | 11/2015 |
| KR | 1020130086733 A | 8/2013 |
| KR | 1020170137258 A | 12/2017 |

*Primary Examiner* — Sheikh Maruf
(74) *Attorney, Agent, or Firm* — CANTOR COLBURN LLP

(57) ABSTRACT

A light-emitting device comprising: a first electrode, a second electrode facing the first electrode; an emission layer disposed between the first electrode and the second electrode; and a first charge transport layer disposed between the first electrode and the emission layer, wherein a band gap energy of the emission layer and a band gap energy of the first charge transport layer are different from each other, the emission layer comprises a first perovskite compound, and the first charge transport layer consists of a second perovskite compound.

19 Claims, 8 Drawing Sheets

(56) References Cited

U.S. PATENT DOCUMENTS

| | | | |
|---|---|---|---|
| 2011/0084291 A1* | 4/2011 | Jeong | H10K 50/841 257/89 |
| 2011/0215302 A1* | 9/2011 | Lhee | H10K 50/852 257/40 |
| 2012/0181544 A1* | 7/2012 | Lee | H10K 59/122 257/40 |
| 2013/0092909 A1* | 4/2013 | Han | H01L 51/5004 257/40 |
| 2016/0118611 A1* | 4/2016 | Han | H01L 51/5278 257/40 |
| 2016/0141502 A1* | 5/2016 | Joo | H01L 51/0067 252/500 |
| 2016/0163990 A1* | 6/2016 | Jung | C09K 11/025 257/40 |
| 2017/0141235 A1* | 5/2017 | Lai | H01L 29/6684 |
| 2017/0149006 A1* | 5/2017 | Park | H01L 51/5044 |
| 2017/0186893 A1 | 6/2017 | Chaudhari et al. | |
| 2017/0352823 A1* | 12/2017 | Kim | H01L 51/0089 |
| 2017/0365719 A1* | 12/2017 | Chen | H01L 29/40111 |
| 2018/0026084 A1* | 1/2018 | Kang | H01L 27/3211 257/40 |
| 2018/0047928 A1 | 2/2018 | Kim et al. | |
| 2018/0233688 A1* | 8/2018 | Chen | H01L 51/502 |
| 2018/0240804 A1* | 8/2018 | Yoo | H01L 21/28088 |
| 2018/0261666 A1* | 9/2018 | Zeng | H01L 29/0878 |
| 2018/0269235 A1 | 9/2018 | Kim | |
| 2019/0103486 A1* | 4/2019 | Rachmady | H01L 29/16 |
| 2019/0103565 A1* | 4/2019 | Hummert | H01L 51/0077 |
| 2019/0148652 A1* | 5/2019 | Yamatani | H01L 51/0067 257/40 |
| 2019/0187087 A1* | 6/2019 | Cao | G01N 31/221 |
| 2019/0346404 A1* | 11/2019 | Tan | H01L 29/78391 |
| 2020/0181157 A1* | 6/2020 | Lee | H01L 51/006 |
| 2020/0357927 A1* | 11/2020 | Hsieh | H01L 29/66545 |
| 2020/0411662 A1* | 12/2020 | Lin | H01L 29/513 |
| 2021/0225952 A1* | 7/2021 | Zhou | H10K 50/82 |
| 2021/0408227 A1* | 12/2021 | O'Brien | H01L 29/42392 |

* cited by examiner

LIGHT-EMITTING DEVICE

CROSS-REFERENCE TO RELATED APPLICATIONS

This application claims priority to and the benefit of Korean Patent Application Nos. 10-2019-0106641, filed on Aug. 29, 2019, and 10-2020-0069843, filed on Jun. 9, 2020, in the Korean Intellectual Property Office, the contents of which are incorporated herein in their entireties by reference.

BACKGROUND

1. Field

One or more embodiments of the present disclosure relate to a light-emitting device including a perovskite compound.

2. Description of Related Art

Light-emitting devices are devices that convert electrical energy into light energy.

Commercial light-emitting devices include an anode, a cathode, and an emission layer that is between the anode and the cathode. Additionally, a hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

Provided is a light-emitting device including a perovskite compound.

Additional aspects will be set forth in part in the description which follows and, in part, will be apparent from the description, or may be learned by practice of the presented exemplary embodiments of the disclosure.

According to an aspect, a light-emitting device includes a first electrode; a second electrode facing the first electrode; an emission layer disposed between the first electrode and the second electrode; and a first charge transport layer disposed between the first electrode and the emission layer, wherein a band gap energy of the emission layer and a band gap energy of the first charge transport layer are different from each other, the emission layer includes a first perovskite compound, and the first charge transport layer consists of a second perovskite compound.

According to another aspect, a light-emitting device includes a first electrode; a second electrode facing the first electrode; and n light-emitting units disposed between the first electrode and the second electrode, wherein n is a natural number of 2 or greater, an $n^{th}$ light-emitting unit includes an $n^{th}$ emission layer and an $n^{th}$ first charge transport layer, and the band gap energy of the $n^{th}$ emission layer is different from the band gap energy of the $n^{th}$ first charge transport layer, an $n-1^{th}$ light-emitting unit includes an $n-1^{th}$ emission layer and an $n-1^{th}$ first charge transport layer, and the band gap energy of the $n-1^{th}$ emission layer is different from the band gap energy of the $n-1^{th}$ first charge transport layer, the $n-1^{th}$ first charge transport layer is disposed between the $n^{th}$ emission layer and the $n-1^{th}$ emission layer, each of the $n^{th}$ emission layer and the $n-1^{th}$ emission layer independently includes a first perovskite compound, and each of the $n^{th}$ first charge transport layer and the $n-1^{th}$ first charge transport layer independently consists of a second perovskite compound.

BRIEF DESCRIPTION OF THE DRAWINGS

These and other aspects of one or more exemplary embodiments of the present disclosure will become more readily apparent from the following description when taken in conjunction with the accompanying drawings, in which.

DETAILED DESCRIPTION

Figure 1:
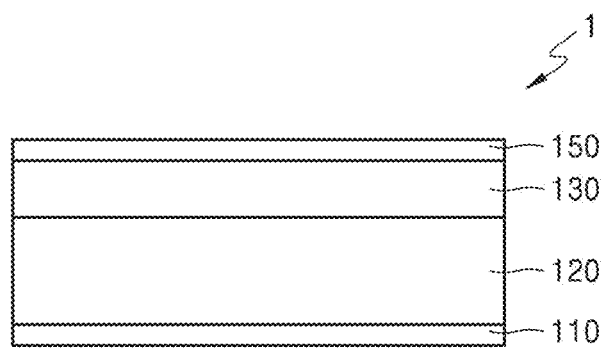
FIG. 1 is a schematic cross-sectional view showing an embodiment of a light-emitting device.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. While exemplary embodiments will be illustrated in the drawings and described in further detail in the detailed description, the exemplary embodiments described herein should not be construed as limited to the particular shapes of regions as illustrated herein but are to include deviations in shapes that result, for example, from manufacturing. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unless otherwise defined, the terms used herein (including technical and scientific terms) have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Like reference numerals in the drawings refer to like components, and the size of each component in the drawings may be exaggerated or reduced for clarity and convenience of description.

When an element is said to be "on" another element, this includes not only the case in which the element is "directly on" another element, but also the case in which an intervening element is disposed therebetween; accordingly, the element can be directly on the other element or intervening elements may be present therebetween. In contrast, when an element is said to be "directly on" another element, there are no intervening elements present.

It will be understood that, although the terms "first," "second," "third," etc. may be used herein to describe various elements, components, regions, layers and/or sections, these elements, components, regions, layers and/or sections should not be limited by these terms. These terms are used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In the present specification, the singular form includes the plural form unless defined otherwise.

The perovskite compound may be a compound having a perovskite crystal structure or a perovskite-like crystal structure. The term "perovskite crystal structure" as used herein refers to a compound in which a first cation is positioned at (0,0,0), a second cation is positioned at (1/2,1/2,1/2), and an anion is positioned at (1/2,1/2,0) in a unit cell. The term "perovskite-like crystal structure" as used herein refers to a compound having a distorted perovskite-like structure having a lower symmetry. Accordingly, the term "perovskite" as used herein refers to both the perovskite crystal structure and the perovskite-like crystal structure.

The term "three-dimensional perovskite structure" as used herein collectively refers to a perovskite structure having a three-dimensional crystal structure.

The term "two-dimensional perovskite structure" as used herein collectively refers to a perovskite structure having not a three-dimensional structure, but a two-dimensional crystal structure or quasi-two-dimensional crystal structure.

The term "Group" used herein refers to a group on the International Union of Pure and Applied Chemistry (IUPAC) Periodic Table of Elements.

The term "alkali metal" as used herein refers to an element of Group 1 of the Periodic Table of Elements.

The term "halogen" as used herein refers to an element of Group 17 of the Periodic Table of Elements.

The term "maximum luminescence wavelength" as used herein refers to a wavelength value (typically in nanometers, nm) corresponding to a point having a maximum emission intensity in a photoluminescence (PL) spectrum of a solution or film sample including a compound.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a light-emitting device will be described in detail with reference to the accompanying drawings.

Light-Emitting Device

According to an aspect, a light-emitting device is provided.

The structure of exemplary light-emitting devices will be described with reference to FIG. 1. FIG. 1 is a schematic cross-sectional view of an exemplary light-emitting device 1 according to one or more embodiments.

In an embodiment, the exemplary light-emitting device 1 includes a first electrode 110; a second electrode 150 facing the first electrode; an emission layer 130 disposed between the first electrode and the second electrode; and a first charge transport layer 120 disposed between the first electrode and the emission layer, wherein a bandgap of the emission layer 130 is different from a bandgap of the first charge transport layer 120, and the emission layer includes a first perovskite compound, and the first charge transport layer 120 consists of a second perovskite compound.

Although not illustrated in FIG. 1, a substrate may be additionally disposed under or beneath the first electrode 110 (in a direction away from the emission layer 130) and/or on the second electrode 150 (in a direction away from the emission layer 130). For use as the substrate, any substrate that is used in light-emitting devices, including those in the art, may be used, and the substrate may be a glass substrate or a transparent plastic substrate, each having excellent mechanical strength, thermal stability, transparency, surface smoothness, ease of handling, and water resistance.

The first electrode 110 may be an anode to which a positive (+) voltage is applied, and the second electrode 150 may be a cathode to which a negative (−) voltage is applied. In one or more embodiments, the first electrode 110 may be a cathode, and the second electrode 150 may be an anode. For convenience, and unless specified otherwise, embodiments will be described assuming that the first electrode 110 is an anode and the second electrode 150 is a cathode.

The first electrode 110 may be formed by depositing or sputtering a material for forming the first electrode 110 on the substrate. The first electrode 110 may be a reflective electrode, a semi-transmissive electrode, or a transmissive electrode. In an embodiment, the first electrode 110 may be variously modified. For example, to obtain a bottom emission type light-emitting device, the first electrode 110 may be a semi-transmissive electrode or a transmissive electrode, and to obtain a top emission type light-emitting device, the first electrode 110 may be a reflective electrode. The first electrode 110 may have a single-layered structure or a multi-layered structure including two or more layers.

The material for forming the first electrode 110 may include a material with a high work function to facilitate the injection of holes. In an embodiment, the material for forming the first electrode 110 may include a fluorine-doped tin oxide (FTO), indium tin oxide (ITO), indium zinc oxide (IZO), aluminum doped zinc oxide (AZO), indium oxide, tin oxide ($SnO_2$), zinc oxide(ZnO), gallium oxide, aluminum oxide, magnesium oxide, or a combination thereof. In one or more embodiments, the material for forming the first electrode 110 may be magnesium (Mg), aluminum (Al), aluminum-lithium (Al—Li), calcium (Ca), magnesium-indium (Mg—In), magnesium-silver (Mg—Ag), or a combination thereof.

The second electrode 150 facing the first electrode 110 may be provided. The second electrode 150 may be a reflective electrode, a semi-transmissive electrode, or a transmissive electrode. In an embodiment, the second electrode 150 may be variously modified. For example, to obtain a bottom emission type light-emitting device, the second electrode 150 may be a semi-transmissive electrode or a transmissive electrode, and to obtain a top emission type light-emitting device, the second electrode 150 may be a reflective electrode. The second electrode 150 may have a single-layered structure or a multi-layered structure including two or more layers.

The second electrode 150 may include metal, an alloy, an electrically conductive compound, or a combination thereof, each of which has a relatively low work function. In an embodiment, the material for the second electrode 150 may include lithium (Li), magnesium (Mg), aluminum (Al), aluminum-lithium (Al—Li), calcium (Ca), gallium (Ga), magnesium-indium (Mg—In), magnesium-silver (Mg—Ag), or a combination thereof. These materials may be used to form the second electrode 150. In one or more embodiments, the material for the second electrode 150 may include ITO, IZO, or a combination thereof.

The emission layer 130 may be disposed between the first electrode 110 and the second electrode 150.

In an embodiment, the emission layer 130 may include a first perovskite compound.

In an embodiment, the emission layer 130 may consist of the first perovskite compound. That is, the emission layer 130 may not include materials other than the first perovskite compound. In an embodiment, the emission layer 130 does not include a p-dopant and/or an n-dopant. For example, the emission layer 130 does not include a p-dopant or an n-dopant for modifying the electron affinity value of the emission layer 130.

In one or more embodiments, the first perovskite compound may be represented by Formula 1:

$$[A^1][B^1][X^1]_3 \quad \text{Formula 1}$$

wherein, in Formula 1, $A^1$ may be a monovalent organic cation, a monovalent inorganic cation, or a combination thereof, $B^1$ may be a divalent metal cation, a divalent metalloid cation, or a combination thereof, and $X^1$ may be at least one monovalent halogen ion.

In one or more embodiments, $A^1$ in Formula 1 may be an ammonium ion, an alkylammonium ion, an arylammonium ion, an arylalkylammonium ion, a formamidinium ion, an alkylamidinium ion, an arylamidinium ion, an arylalkylamidinium ion, an alkali metal ion, or a combination thereof, $B^1$ may be $Pb^{2+}$, $Sn^{2+}$, $Bi^{2+}$, $Sb^{2+}$, $Cu^{2+}$, $Ag^{2+}$, $Au^{2+}$, $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof, and $X^1$ may be $Cl^-$, $Br^-$, $I^-$, or a combination thereof.

In one or more embodiments, $A^1$ in Formula 1 may be a methylammonium (MA) ion, a formamidinium (FA) ion, $Cs^+$, or a combination thereof, $B^1$ may be $Pb^{2+}$, and $X^1$ may be $Cl^-$, $Br^-$, or a combination thereof.

In an embodiment, the first perovskite compound may be $MAPbBr_3$ or $(MA)_xCs_{(1-x)}PbBr_3$ (herein, x may be a real number that is greater than 0 and less than or equal to 1).

In the emission layer 130, electrons and holes transferred by the voltage supplied by the first electrode 110 and the second electrode 150 may be combined together. The electrons and holes are combined together to produce excitons, and then the excitons transition from the excited state to the ground state, thereby emitting light. The light-emitting device 1 may have high color purity, high current efficiency, and high quantum efficiency, due to the inclusion of the first perovskite compound represented by Formula 1 as described above.

When the light-emitting device 1 is a full color light-emitting device, the light-emitting device 1 may include an emission layer that emits light of different color for each subpixel.

In one or more embodiments, the emission layer may be patterned, for each subpixel, as a first color emission layer, a second color emission layer, and a third color emission layer. In this regard, at least one emission layer from among the above-described emission layers may necessarily include the first perovskite compound. In an embodiment, the first color emission layer may be an emission layer that includes the first perovskite compound, and the second color emission layer and the third color emission layer may be organic emission layers that include different organic compounds. In this regard, the first color through the third color are different colors, and for example, the first color through the third color may have different maximum luminescence wavelengths. The first color through the third color may be white when combined with each other.

In one or more embodiments, the emission layer may further include a fourth color emission layer, and at least one emission layer from among the first color emission layer through the fourth color emission layer is an emission layer including the first perovskite compound, and the other emission layers may be organic emission layers that include different organic compounds. In this regard, the first color through the fourth color are different colors, and for example, the first color through the fourth color may have different maximum luminescence wavelengths. The first color through the fourth color may be white when combined with each other.

In one or more embodiments, the light-emitting device may have a stacked structure in which two or more emission layers emitting light of different colors contact each other or are separated from each other. At least one emission layer from among the two or more emission layers may be an emission layer including the first perovskite compound, and the remaining emission layers may each be an organic emission layer including an organic compound.

The thickness of the emission layer 130 may be from about 100 nanometers (nm) to about 500 nm. When the thickness of the emission layer 130 is within the range, excellent luminescence characteristics may be obtained without a substantial increase in driving voltage.

The first charge transport layer 120 may be disposed between the first electrode 110 and the emission layer 130. In an embodiment, the first charge transport layer 120 may consist of a second perovskite compound. That is, the first charge transport layer 120 may not include materials other than the second perovskite compound. In an embodiment, the first charge transport layer 120 does not include a p-dopant and/or an n-dopant. For example, the first charge transport layer 120 may not include a p-dopant or an n-dopant for modifying the electron affinity value of the first charge transport layer 120.

In an embodiment, the first charge transport layer 120 may contain no organic compound or metal oxide.

The band gap energy of the emission layer 130 and the band gap energy of the first charge transport layer 120 may be different from each other. In an embodiment, the band gap energy of the emission layer 130 may be less than the band gap energy of the first charge transport layer 120. In one or more embodiments, when the band gap energy of the emission layer is 2.7 electron volts (eV), the band gap energy of the first charge transport layer may be 3.0 eV.

Accordingly, the first perovskite compound and the second perovskite compound may be different from each other.

The emission layer 130 may be in direct contact with the first charge transport layer 120.

In an embodiment, the first charge transport layer 120 may include a second perovskite compound represented by Formula 2:

$$[A^2][B^2][X^2]_3 \qquad \text{Formula 2}$$

wherein, in Formula 2, $A^2$ may be a monovalent organic cation, a monovalent inorganic cation, or a combination thereof, $B^2$ may be a divalent metal cation, a divalent metalloid cation, or a combination thereof, and $X^2$ may be at least one monovalent halogen ion.

The second perovskite compound has a relatively high electron or hole mobility from about 1 cm$^2$/Vs to 200 cm$^2$/Vs when measured in a thin film, a low inter-band trap density, and a high transmittance for light having a greater energy than a band gap energy (about 90% or greater).

In one or more embodiments, $A^2$ in Formula 2 may be an ammonium ion, an alkylammonium ion, an arylammonium ion, an arylalkylammonium ion, a formamidinium ion, an alkylamidinium ion, an arylamidinium ion, an arylalkylamidinium ion, an alkali metal ion, or a combination thereof, $B^2$ may be Pb$^{2+}$, Sn$^{2+}$, Bi$^{2+}$, Sb$^{2+}$, Cu$^{2+}$, Ag$^{2+}$, Au$^{2+}$, La$^{2+}$, Ce$^{2+}$, Pr$^{2+}$, Nd$^{2+}$, Pm$^{2+}$, Sm$^{2+}$, Eu$^{2+}$, Gd$^{2+}$, Tb$^{2+}$, Dy$^{2+}$, Ho$^{2+}$, Er$^{2+}$, Tm$^{2+}$, Yb$^{2+}$, Lu$^{2+}$, Be$^{2+}$, Mg$^{2+}$, Ca$^{2+}$, Sr$^{2+}$, Ba$^{2+}$, Ra$^{2+}$, or a combination thereof, and $X^2$ may be Cl$^-$, Br$^-$, I$^-$, or a combination thereof.

In one or more embodiments, $A^2$ in Formula 2 may be a methylammonium (MA) ion, a formamidinium (FA) ion, Cs$^+$, or a combination thereof, $B^2$ may be Pb$^{2+}$, and $X^2$ may be Cl$^-$, Br$^-$, or a combination thereof.

In an embodiment, the second perovskite compound may be FAPbCl$_3$ or (MA)$_x$Cs$_{(1-x)}$PbCl$_3$ (herein, x may be a real number that is greater than 0 and less than or equal to 1).

The light-emitting device may address lifespan and/or efficiency problems such as excitons' quenching due to interfacial defects, transport charge loss, etc. by forming a halogen-mixed interface that is substantially free of interaction traps.

In addition, since the first charge transport layer is formed using the second perovskite compound, process limitations during the manufacture of a light-emitting device may be small. In the case of perovskite light-emitting devices of the related art, materials commonly used in organic light-emitting devices manufactured by a solution process are used for a charge injection/transport layer, or MoO$_x$ (as a material for hole injection layer), SnO$_2$, ZnSiO$_4$, TiO$_2$ (as a material for electron transport layer), and NiO$_x$ (as a material for hole transport layer) are used for a charge injection/transport layer. However, since most organic materials for use in charge injection/transport layers, which are provided using a solution process, are hydrophobic, it may be difficult to provide a perovskite-containing emission layer through a solution process by providing a perovskite precursor thereto. As a material for use in organic charge injection/transport layers which can be provided through a solution process, PEDOT/PSS, which provides a hydrophilic surface, can be used. In the case in which a perovskite-containing emission layer is to be provided through a solution process on an organic charge injection/transport layer, perovskite nano crystals (QD, NC, 2D) are synthesized ex-situ, and may be then provided onto the organic charge injection/transport layer by using the hydrophobic characteristics of the ligand at the surface of the perovskite nano crystal. As described above, the organic charge injection/transport layer has limitations in the process and the thickness of tens of nanometers or less due to relatively low hole mobility (less than $10^{-4}$ $cm^2/Vs$). In addition, oxide-based charge injection/transport layers have a relatively low hole mobility (up to $10^{-2}$ $cm^2/Vs$).

The thickness of the first charge transport layer 120 may be from about 100 nm to about 1000 nm. When the thickness of the first charge transport layer 120 is within the range, excellent luminescence characteristics may be obtained without a substantial increase in driving voltage.

In one or more embodiments, the first electrode 110 is an anode, the second electrode 150 is a cathode, and the first charge transport layer 120 may be a hole transport layer.

In one or more embodiments, the first electrode 110 is a cathode, the second electrode 150 is an anode, and the first charge transport layer 120 may be an electron transport layer.

In one or more embodiments, an auxiliary layer may be further included to improve device characteristics such as luminescence efficiency by adjusting the charge carrier balance inside a device between the first electrode 110 and the emission layer 130 and/or between the second electrode 150 and the emission layer 130.

In one or more embodiments, when the first electrode 110 is an anode and the second electrode 150 is a cathode, a hole transport region may be further disposed between the first electrode 110 and the emission layer 130, and an electron transport region may be further disposed between the second electrode 150 and the emission layer 130. The first charge transport layer 120 may be included in the hole transport region.

In one or more embodiments, when the first electrode 110 is a cathode and the second electrode 150 is an anode, an electron transport region may be further disposed between the first electrode 110 and the emission layer 130, and a hole transport region may be disposed between the second electrode 150 and the emission layer 130. The first charge transport layer 120 may be included in the electron transport region.

In an embodiment, the hole transport region may inject and/or transport holes from the first electrode 110 to the emission layer 130. Additionally, the hole transport region may compensate for an optical resonance distance according to a wavelength of light emitted from the emission layer, and thus, efficiency of a formed organic light-emitting device may be improved.

The hole transport region may include at least one selected from a hole injection layer, a hole transport layer, and a charge control layer. The hole transport region may have a single-layered structure or a multi-layered structure including two or more layers. In detail, the hole transport region may include only either a hole injection layer or a hole transport layer. In one or more embodiments, the hole transport region may have a hole injection layer/hole transport layer structure or a hole injection layer/hole transport layer/charge control layer structure, which are sequentially stacked in this stated order from the first electrode 110.

The hole transport region may include, for example, 1,3-bis(9-carbazolyl)benzene (mCP), 4,4'-bis(N-carbazolyl)-1,1'-biphenyl (CBP), 3,3-bis(carbazol-9-yl)biphenyl (mCBP), 4,4',4"-tris[phenyl(m-tolyl)amino]triphenylamine (m-MTDATA), TDATA, 2-TNATA, N, N'-di(1-naphthyl)-N, N'-diphenyl-(1,1'-biphenyl)-4,4'-diamine (NPB), β-NPB, N,N'-bis(3-methylphenyl)-N,N'-diphenylbenzidine (TPD), spiro-TPD, spiro-NPB, methylated-NPB, 1,1-bis(4-(N,N'-di (p-tolyl)amino)phenyl)cyclohexane (TAPC), HMTP D, tris (4-carbazoyl-9-ylphenyl)amine (TCTA), polyaniline/dodecylbenzenesulfonic acid (PANI/DBSA), poly(3,4-ethylenedioxythiophene): poly(4-styrenesulfonate) (PEDOT/PSS), PEDOT/PSS/perfluorinated ionomer (PFI), poly(9,9-dioctyl-fluorene-co-N-(4-butylphenyl)-diphenylamine (TFB), poly(fluorine-co-triphenylamine) (PFO-TPA), poly(arylamine), poly(N-vinylcarbazole) (PVK), polypyrrole, polyaniline/camphor sulfonicacid (PANI/CSA), polyaniline/poly(4-styrenesulfonate) (PANI/PSS), 4,4'4"-tris(N-carbazoly) triphenylamine bis(vinylbenzylether) (VB-TCTA), or VB-DATA, but embodiments of the present disclosure are not limited thereto:

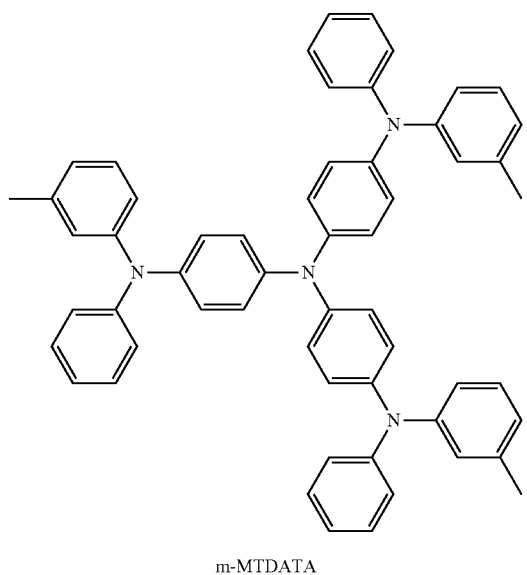

m-MTDATA

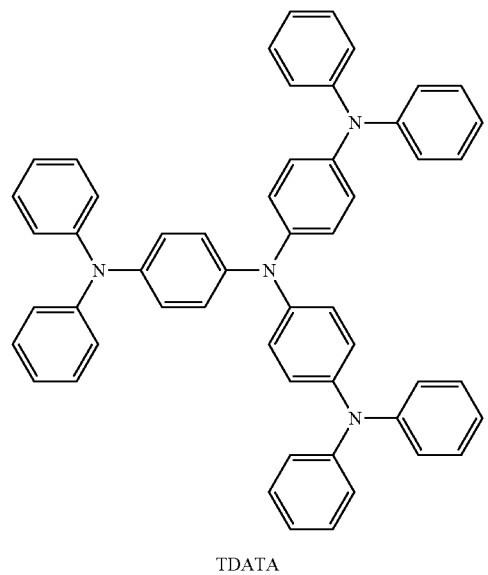

TDATA

-continued
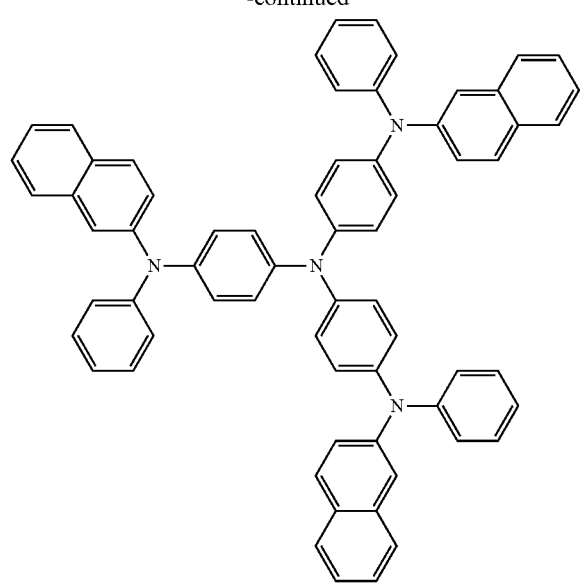
2-TNATA
NPB
β-NPB
TPD
-continued
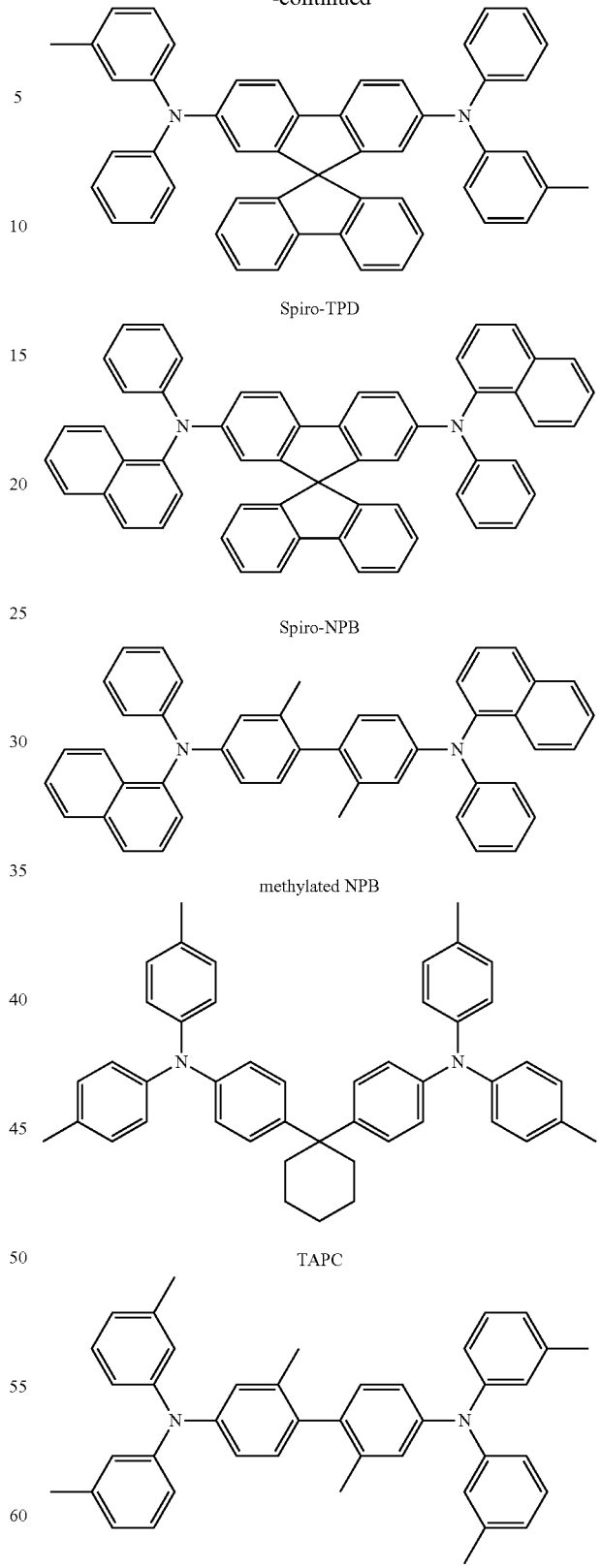
Spiro-TPD
Spiro-NPB
methylated NPB
TAPC
HMTPD
The thickness of the hole transport region may be determined in consideration of the wavelength of light emitted from an emission layer, and the driving voltage and current efficiency of a light-emitting device. In one or more embodiments, the thickness of the hole transport region may be from about 10 nm to about 1000 nm, for example, about 10 nm to about 100 nm. When the hole transport region includes a hole injection layer and a hole transport layer, the thickness of the hole injection layer may be about from 10 nm to about 200 nm, and the thickness of the hole transport layer may be from about 5 nm to about 100 nm.

The hole transport region may further include, in addition to these materials, a p-dopant for the improvement of conductive properties. The p-dopant may be homogeneously or non-homogeneously dispersed in the hole transport region.

The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as dipyrazino[2,3-f:2',3'-h]quinoxaline-2,3,6,7,10,11-hexacarbonitrile (HAT-CN), but are not limited thereto.

In an embodiment, the electron transport region may inject and/or transport electrons from the second electrode 150 to the emission layer 130. Additionally, the electron transport region may compensate for an optical resonance distance according to a wavelength of light emitted from the emission layer, and thus, efficiency of a light-emitting device may be improved.

The electron transport region may include at least one selected from an electron injection layer, an electron transport layer, and a charge control layer. The electron transport region may have a single-layered structure or a multi-layered structure including two or more layers. In detail, the electron transport region may include only either an electron injection layer or an electron transport layer. In an embodiment, the hole transport region may have an electron transport layer/electron injection layer structure or a charge control layer/electron transport layer/electron injection layer structure, wherein, in each structure, constituting layers are sequentially stacked from the emission layer 130.

The electron transport region may include, for example, at least one of Alq₃, bathocuproine (BCP), 4,7-diphenyl-1,10-phenanthroline (Bphen), bis(2-methyl-8-quinolinolato-N1, O8)-(1,1'-biphenyl-4-olato)aluminum) (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), bis(10-hydroxybenzo[h]quinolinato)beryllium (Bebq₂), B₃PYMPM, TPBI, 3TPYMB, BmPyPB, TmPyPB, BSFM, PO-T2T, PO15, or (8-(4-(4,6-di(naphthalen-2-yl)-1, 3,5-triazin-2-yl)phenyl)quinolone (ET204), but embodiments of the present disclosure are not limited thereto. In an embodiment, the electron transport layer and/or charge control layer may include at least one of the compounds as described above, but embodiments of the present disclosure are not limited thereto.

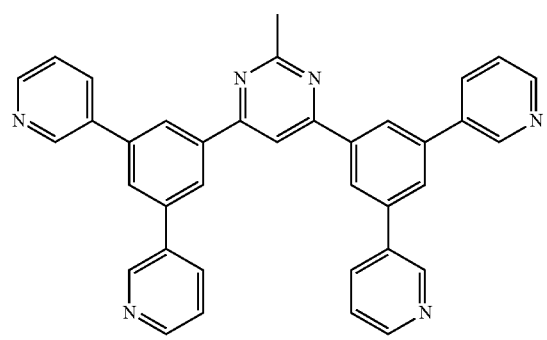

B3PYMPM

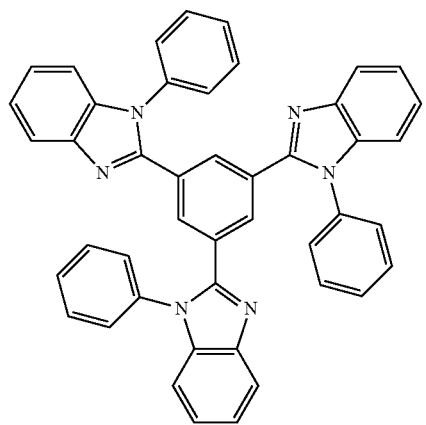

TPBI

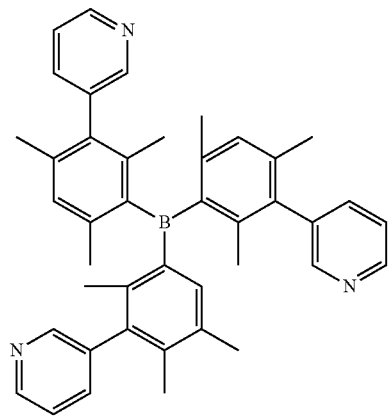

3TPYMB

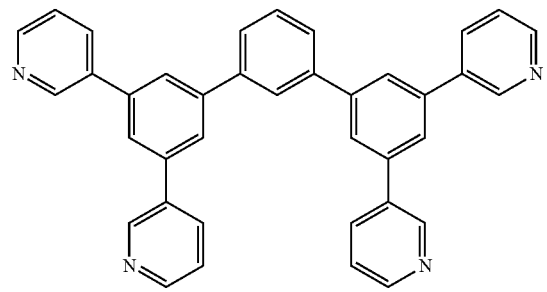

BmPyPB

-continued

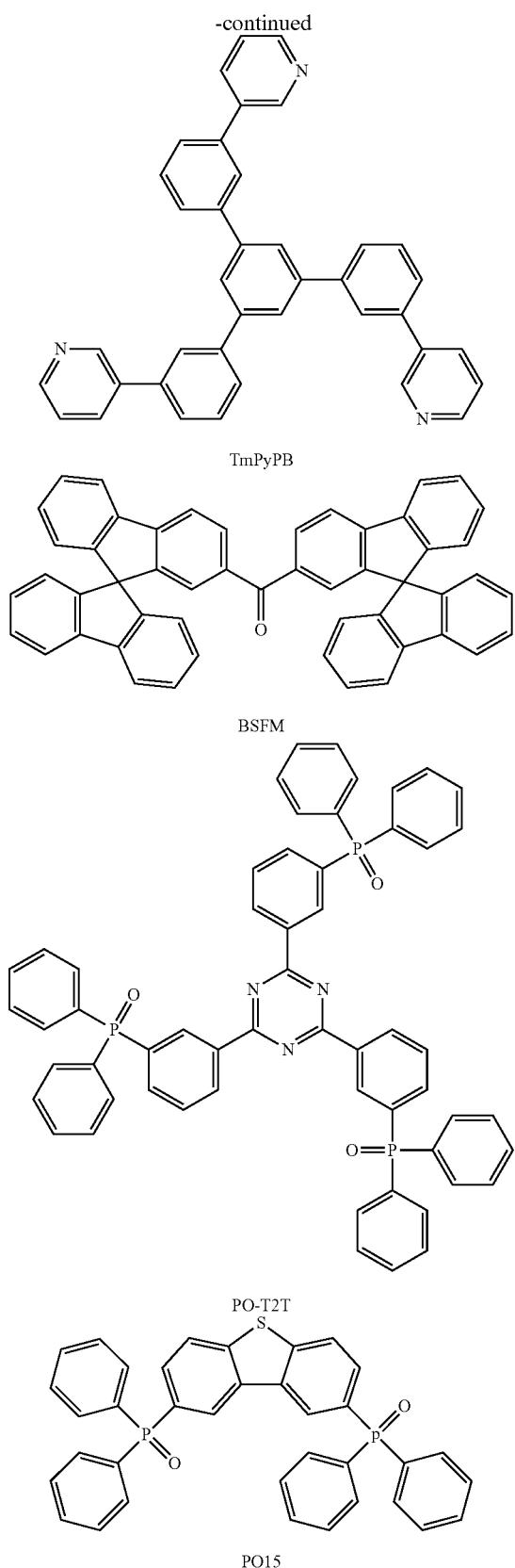

TmPyPB

BSFM

PO-T2T

PO15

In one or more embodiments, the electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or a combination thereof. In one or more embodiments, the electron injection layer may further include the organic material as described above.

In one or more embodiments, the electron injection layer may consist of LiF, NaF, CsF, KF, $Li_2O$, $Cs_2O$, $K_2O$, BaO, SrO, CaO, 8-quinolinolatolithium (LiQ), Cs, or a combination thereof, or may further include the organic compound as described above, but embodiments of the present disclosure are not limited thereto.

The thickness of the electron transport region may be determined in consideration of the wavelength of light emitted from an emission layer, and the driving voltage and current efficiency of a light-emitting device. In one or more embodiments, the thickness of the electron transport region may be from about 1 nm to about 1000 nm, for example, from about 1 nm to about 200 nm. When the electron transport region includes an electron injection layer and an electron transport layer, the thickness of the electron injection layer may be about from 1 nm to about 50 nm, and the thickness of the electron transport layer may be from about 5 nm to about 100 nm.

The charge control layer may be included to adjust the charge injection balance at the interface between a layer containing an organic compound (for example, a hole transport layer, an electron transport layer, etc.) and a layer containing an inorganic compound (for example, an emission layer). The charge control layer may include a polymer compound, for example, poly(methyl methacrylate) (PMMA), polyimide (PI), poly vinyl alcohol (PVA), a combination thereof, or a copolymer thereof, but embodiments of the present disclosure are not limited thereto. Due to the inclusion of the electron control layer, the charge injection balance of the light-emitting device is improved, and thus, the external quantum efficiency may be increased. In addition, by placing the electron control layer to be directly adjacent to the emission layer, the emission layer may be formed flat and the driving voltage of the light-emitting device may be lowered.

Each layer of the light-emitting device 1 may be formed using various methods such as a dry process, for example, a vacuum deposition method, or LB method, or a solution process, for example, a spin coating method, or a cast method.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

In an embodiment, the light-emitting device 1 may be manufactured by providing the first charge transport layer 120 on a substrate and the emission layer 130 on the first charge transport layer. In this regard, the first charge transport layer 120 and the emission layer 130 may each be provided using a solution process.

The providing of a first charge transport layer may include providing a second mixture including at least one selected from $A^2$-containing precursors, at least one selected from $B^2$-containing precursors, and a second solvent, crystallizing the mixture by adding a second antisolvent thereto, and heat-treating the resultant to remove the second solvent and the second antisolvent therefrom.

In the second mixture, the molar ratio of at least one selected from $A^2$-containing precursors and at least one selected from $B^2$-containing precursors may be determined according to the composition of the second perovskite compound represented by Formula 2 that is finally produced.

The providing of an emission layer may include providing a first mixture including at least one selected from $A^1$-containing precursors, at least one selected from $B^1$-containing precursors, and a first solvent, crystallizing the mixture by adding a first antisolvent thereto, and heat-treating the resultant to remove the first solvent and the first antisolvent therefrom.

In the first mixture, the molar ratio of at least one selected from $A^1$-containing precursors and at least one selected from $B^1$-containing precursors may be determined according to the composition of the first perovskite compound represented by Formula 1 that is finally produced.

In one or more embodiments, the first mixture and the second mixture may each be provided by spin coating. Conditions for the spin coating include a coating speed of about 300 revolutions per minute (rpm) to about 4000 rpm and a temperature range from about 80° C. to about 200° C., and may be determined in consideration of the composition of the first mixture and the second mixture. The coating speed may be adjusted differently according to a section. In an embodiment, the coating speed may be maintained from about 300 rpm to 700 rpm in the first section, and then, in the second section, from about 2000 rpm to 4000 rpm.

On the other hand, the first mixture and the second mixture may be provided on the substrate by applying a variety of different known methods.

The first solvent and the second solvent may each be selected from materials having high solubility with respect to a precursor. In one or more embodiments, the first solvent and the second solvent may each be dimethyl formamide, dimethyl sulfoxide, γ-butyrolactone, N-methyl-2-pyrrolidone, or a combination thereof, but embodiments of the present disclosure are not limited thereto.

Then, crystallization is performed by adding the first antisolvent or the second antisolvent, respectively, on the substrate provided with the first mixture and the substrate provided with the second mixture.

In one or more embodiments, when the first mixture and the second mixture are provided by spin coating, the first mixture and the second mixture are spin coated, and then the corresponding substrates are continuously rotated while the first antisolvent or the second antisolvent are added dropwise or added by spraying, but embodiments are not limited thereto.

The first antisolvent and the second antisolvent may each be selected from materials that have low solubility with respect to a precursor. In one or more embodiments, the first antisolvent and the second antisolvent may each be diethyl ether, toluene, α-terpineol, hexyl carbitol, butyl carbitol acetate, hexyl cellosolve, butyl cellosolve acetate, or a combination thereof, but embodiments of the present disclosure are not limited thereto. In an embodiment, the first antisolvent or the second antisolvent may each be diethyl ether.

Then, the heat treatment is performed to remove the first solvent, the second solvent, the first antisolvent, and the second antisolvent.

In one or more embodiments, the heat treatment condition may be determined in consideration of the composition of the first mixture and the second mixture, and may include the heat treatment time from 15 minutes to 2 hours and the heat treatment temperature from about 50° C. to about 200° C.

When the emission layer 130 is provided, not to make the first charge transport layer 120 to be dissolved, at least one selected from $A^2$-containing precursors, at least one selected from $B^2$-containing precursors, and the second perovskite compound may each have a solubility that is relatively low with respect to the first solvent.

On the other hand, at least one selected from $A^1$-containing precursors and at least one selected from $B^1$-containing precursors, which are used to provide the emission layer 130, may each have a relatively high solubility with respect to the first solvent.

The descriptions of $A^1$, $A^2$, $B^1$, and $B^2$ in $A^1$-containing precursors, $A^2$-containing precursors, $B^1$-containing precursors, and $B^2$-containing precursors may be the same as described in connection with the descriptions of $A^1$, $A^2$, $B^1$, and $B^2$ in Formula 1.

In one or more embodiments, the $A^1$-containing precursors may be $A^1$ halides (for example, $(A^1)(X)$), the $A^2$-containing precursors may be $A^2$ halides (for example, $(A^2)(X)$), the $B^1$-containing precursors may be $B^1$ halides (for example, $(B^1)(X)_2$), and the $B^2$-containing precursors may be $B^2$ halides (for example, $(B^2)(X)_2$). The descriptions of $A^1$, $A^2$, $B^1$, $B^2$, $X^1$ and $X^2$ in $(A^1)(X^1)$, $(A^2)(X^2)$, $(B^1)(X^1)_2$ and $(B^2)(X^2)_2$ may each be the same as described in connection with Formulae 1 and 2.

Figure 2:
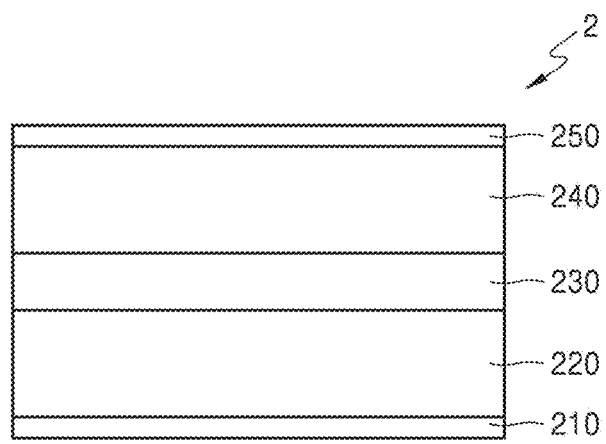
FIG. 2 is a schematic cross-sectional view showing an embodiment of a light-emitting device.

The structure of the light-emitting device 2 according to another embodiment will be described with reference to FIG. 2. FIG. 2 is a schematic cross-sectional view of the light-emitting device 2 according to an embodiment. Hereinafter, embodiments will be described based on the difference with respect to the embodiments described in connection with FIG. 1.

In an embodiment, the light-emitting device 2 may further include a second charge transport layer 240 disposed between an emission layer 230 and a second electrode 250. The band gap energy of the emission layer 230 and the band gap energy of the second charge transport layer 240 may be different from each other, and the second charge transport layer 240 may include a third perovskite compound.

In an embodiment, the second charge transport layer 240 may consist of the third perovskite compound. That is, the second charge transport layer 240 may not include any material other than the third perovskite compound. In an embodiment, the second charge transport layer 240 does not include a p-dopant and/or an n-dopant. For example, the second charge transport layer 240 does not include a p-dopant or an n-dopant for modifying the electron affinity value of the second charge transport layer 240.

In an embodiment, the second charge transport layer 240 may not include an organic compound or a metal oxide.

The band gap energy of the emission layer 230 and the band gap energy of the second charge transport layer 240 may be different from each other. In an embodiment, the band gap energy of the emission layer 230 may be less than that of the second charge transport layer 240. In one or more embodiments, when the band gap energy of the emission layer is about 2.7 eV, the band gap energy of the second charge transport layer may be about 3.0 eV.

Accordingly, the second perovskite compound and the third perovskite compound may be identical to each other.

In an embodiment, the first perovskite compound and the third perovskite compound may be identical to each other.

The emission layer 230 may be in direct contact with the second charge transport layer 240.

In an embodiment, the second charge transport layer 240 may include a third perovskite compound represented by Formula 3:

$$[A^3][B^3][X^3]_3 \quad \text{Formula 3}$$

wherein, in Formula 3,

A$^3$ may be a monovalent organic cation, a monovalent inorganic cation, or a combination thereof, B$^3$ may be a divalent metal cation, a divalent metalloid cation, or a combination thereof, and X$^3$ may be at least one monovalent halogen ion.

The third perovskite compound has a relatively high electron or hole mobility from about 1 square centimeters per volt second (cm$^2$/Vs) to about 200 cm$^2$/Vs when measured in a thin film, a low inter-band trap density, and a high transmittance for light having a greater energy than a band gap energy (about 90% or greater).

In one or more embodiments, A$^3$ in Formula 3 may be an ammonium ion, an alkylammonium ion, an arylammonium ion, an arylalkylammonium ion, a formamidinium ion, an alkylamidinium ion, arylamidinium ion, arylalkylamidinium ion, an alkali metal ion, or a combination thereof, B$^3$ may be Pb$^{2+}$, Sn$^{2+}$, Bi$^{2+}$, Sb$^{2+}$, Cu$^{2+}$, Ag$^{2+}$, Au$^{2+}$, La$^{2+}$, Ce$^{2+}$, Pr$^{2+}$, Nd$^{2+}$, Pm$^{2+}$, Sm$^{2+}$, Eu$^{2+}$, Gd$^{2+}$, Tb$^{2+}$, Dy$^{2+}$, Ho$^{2+}$, Er$^{2+}$, Tm$^{2+}$, Yb$^{2+}$, Lu$^{2+}$, Be$^{2+}$, Mg$^{2+}$, Ca$^{2+}$, Sr$^{2+}$, Ba$^{2+}$, Ra$^{2+}$, or a combination thereof, and X$^3$ may be Cl$^-$, Br$^-$, I$^-$, or a combination thereof.

In one or more embodiments, A$^3$ in Formula 3 may be a methylammonium (MA) ion, a formamidinium (FA) ion, Cs$^+$, or a combination thereof, B$^3$ may be Pb$^{2+}$, and X$^3$ may be Cl$^-$, Br$^-$, or a combination thereof.

In an embodiment, the third perovskite compound may be MA$_x$Cs$_{(1-x)}$PbCl$_3$ (herein, x may be a real number that is greater than 0 and less than or equal to 1).

In an embodiment, the emission layer 230 includes a first perovskite compound, the second charge transport layer 240 includes a third perovskite compound, and the emission layer 230 and the second charge transport layer 240 are in direct contact with each other. As a result, an almost perfect interface trap-free halide intermixed interface may be formed to solve the lifespan and efficiency-related problems, such as exciton quenching and transport charge loss due to interface defects.

The thickness of the second charge transport layer 240 may be from about 100 nm to about 1000 nm. When the thickness of the second charge transport layer 240 is within these ranges, excellent luminescence characteristics may be obtained without a substantial increase in driving voltage.

In one or more embodiments, a first electrode 210 may be an anode, the second electrode 250 may be a cathode, a first charge transport layer 220 may be a hole transport layer, and the second charge transport layer 240 may be an electron transport layer.

In one or more embodiments, a first electrode 210 may be a cathode, the second electrode 250 may be an anode, a first charge transport layer 220 may be an electron transport layer, and the second charge transport layer 240 may be a hole transport layer.

In an embodiment, a material included in the first charge transport layer 220 may be the same as a material included in the second charge transport layer 240.

The light-emitting device 2 may be manufactured by providing the first charge transport layer 220 on a substrate, the emission layer 230 on the first charge transport layer 220, and a second charge transport layer 240 on the emission layer 230. In this regard, the first charge transport layer 220 and the emission layer 230 may each be provided using a solution process. The second charge transport layer 240 may be provided by a solution process or a dry process.

When the second charge transport layer 240 is provided through a solution process, the same description provided in connection with the providing of the first charge transport layer may be referred to.

In detail, the providing of the second charge transport layer 240 may include providing a third mixture including at least one selected from A$^3$-containing precursors, at least one selected from B$^3$-containing precursors, and a third solvent, crystallizing the mixture by adding a third antisolvent thereto, and heat-treating the resultant to remove the third solvent and the third antisolvent therefrom.

When the second charge transport layer 240 is provided, not to make the emission layer 230 to be dissolved, at least one selected from A$^1$-containing precursors, at least one selected from B$^1$-containing precursors, and the first perovskite compound may each have a solubility that is relatively low with respect to the third solvent.

On the other hand, at least one selected from A$^3$-containing precursors and at least one selected from B$^3$-containing precursors, which are used to provide the second charge transport layer 240, may each have a relatively high solubility with respect to the third solvent.

When the second charge transport layer 240 is provided by a dry process, at least one selected from A$^3$-containing precursors and at least one selected from B$^3$-containing precursors are deposited on at the same time and then the resultant structure is heat treated thereon, thereby manufacturing the second charge transport layer.

When the second charge transport layer 240 is provided by a dry process, at least one selected from B$^3$-containing precursors is deposited to form a thin film, and then, at least one selected from A$^3$-containing precursors are deposited, and then the resultant structure is heat treated thereon, thereby manufacturing the second charge transport layer.

In an embodiment, a light-emitting device 3 may include a first electrode 310; a second electrode 350 facing the first electrode; and n light-emitting units (ELU) disposed between the first electrode and the second electrode, wherein n is a natural number of 2 or greater, the n$^{th}$ light-emitting unit includes an n$^{th}$ emission layer and an n$^{th}$ first charge transport layer, the band gap energy of the n$^{th}$ emission layer and the band gap energy of the n$^{th}$ first charge transport layer may be different from each other, the n−1$^{st}$ light-emitting unit may include an n−1$^{st}$ emission layer and an n−1$^{th}$ first charge transport layer, the band gap energy of the n−1$^{st}$ emission layer and the band gap energy of the n−1$^{st}$ first charge transport layer may be different from each other, the n−1$^{st}$ first charge transport layer is disposed between the n$^{th}$ emission layer and the n−1$^{st}$ emission layer; the n$^{th}$ emission layer and the n−1$^{st}$ emission layer may each independently include the first perovskite compound, and each of the n$^{th}$ first charge transport layer and the n–1$^{st}$ first charge transport layer may independently consist of the second perovskite compound.

Figure 3:
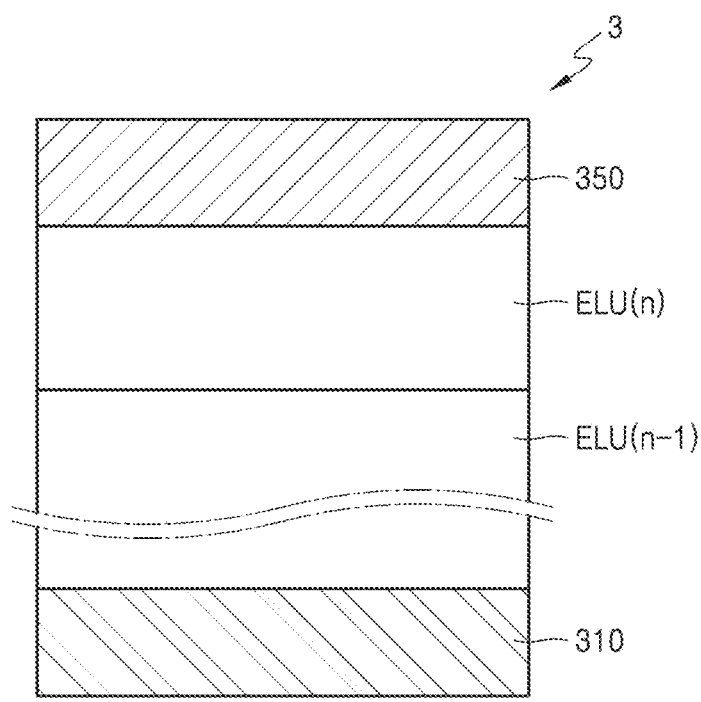
FIG. 3 is a schematic cross-sectional view showing an embodiment of a light-emitting device.

The structure of the light-emitting device 3 will be described with reference to FIG. 3. FIG. 3 is a schematic cross-sectional view of the light-emitting device 3 according to an embodiment. Hereinafter, embodiments will be described based on FIG. 3 and with reference to the embodiments described in connection with FIG. 1.

In an embodiment, the n$^{th}$ emission layer and the n$^{th}$ first charge transport layer may be in direct contact each other, the n–1$^{st}$ emission layer and the n–1$^{st}$ first charge transport layer may be in direct contact each other, and the n–1$^{th}$ emission layer and the n$^{th}$ first charge transport layer may be in direct contact each other. That is, the light-emitting device may have a structure in which an emission layer and a first charge transport layer are alternately stacked.

For example, the first perovskite compound and the second perovskite compound may be different from each other.

Accordingly, the band gap energy of the n$^{th}$ emission layer may be less than that of the n$^{th}$ first charge transport layer.

As a result, the light-emitting device has n emission layers and may have n quantum well structures.

In one or more embodiments, a second charge transport layer may be further disposed between the second electrode 350 and the n$^{th}$ light-emitting unit.

Hereinbefore, the light-emitting device according to an embodiment has been described in connection with FIGS. 1 to 3, but embodiments of the present disclosure are not limited thereto.

Hereinafter, one or more embodiments of the present disclosure will now be described in detail. With reference to the Examples below, an exemplary first perovskite compound, an exemplary method of manufacturing the same, and an exemplary light-emitting device including the same will be described in further detail. However, the present disclosure is not limited to these Examples. These Examples are only for illustrative purposes and are not intended to limit the scope of the one or more embodiments of the present disclosure.

EXAMPLES

The wording "'B' was used instead of 'A'" used in describing the Synthesis Examples means that an amount of component 'A' that was used was identical to an amount of component 'B' that was used, in terms of a molar equivalent.

Evaluation Example 1

Measurements of Band Gap Energy of FAPbCl$_3$ and MAPbBr$_3$

Figure 4:
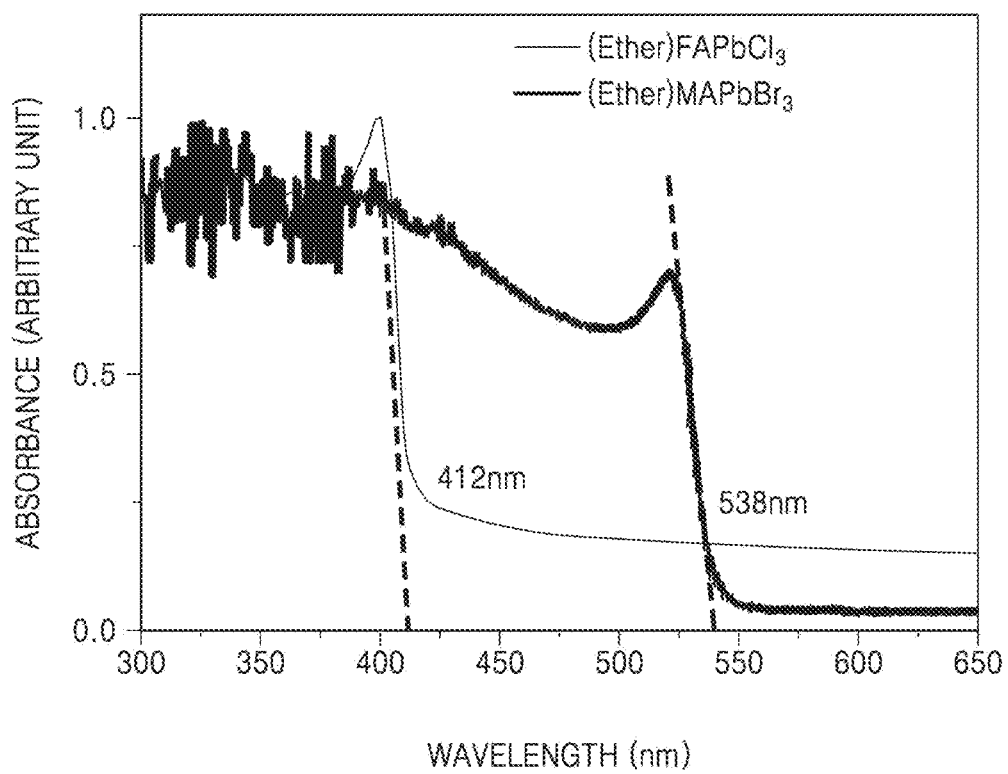
FIG. 4 is a graph of absorbance (arbitrary unit) versus wavelength (nanometer, nm) and shows an ultraviolet (UV)-visible (Vis) spectrum of $FAPbCl_3$ and $MaPbBr_3$.

A 2.5 molar (M) solution of DMSO in which FACl was mixed with PbCl$_2$ at a molar ratio of 1:1 was spin-coated on a glass substrate at the rate of 500 rpm for 30 seconds, and then at the rate of 2,000 rpm to 4,000 rpm for 30 seconds. In this regard, diethyl ether started to be added dropwise thereto at the time of 50 seconds after the spin coating. The resultant structure was heat treated at a temperature of from 60° C. to 120° C. for 10 minutes to form an organic substrate with a FAPbCl$_3$ layer having a thickness of 200 nm thereon. An organic substrate with a MAPbBr$_3$ layer having a thickness of 200 nm thereon was manufactured in the same as manner as described above, except that MABr was used instead of FACl, and PbBr$_2$ was used instead of PbCl$_2$. The ultraviolet (UV)-visible (Vis) spectra of these substrates are shown in FIG. 4. From these results, it was confirmed that the band gap energy of FAPbCl$_3$ is 3.0 eV, and the band gap energy of MAPbBr$_3$ is 2.3 eV.

Example 1

A light-emitting device having the structure of ITO (anode)/molybdenum oxide (10 nm)(hole injection layer)/FAPbCl$_3$ (100 nm to 1000 nm)(hole transport layer)/MAPbBr$_3$ (100 nm to 500 nm)(emission layer)/TPBI (35 nm)(electron transport layer)/LiQ (1 nm)(electron injection layer)/Al (100 nm)(cathode) was manufactured.

A light-emitting device was manufactured in the following manner, but other suitable methods may be used.

A hole injection layer having a thickness of 10 nm was formed by vacuum thermal depositing molybdenum oxide (MoO$_x$) on ITO. Then, the substrate was treated with UV-ozone for 20 minutes.

On the hole injection layer, the FAPbCl$_3$ precursor solution prepared according to Preparation Method 1 described below was spin-coated at 4000 rpm for 20 seconds while being added dropwise. Then, diethyl ether was added dropwise in an amount of 0.5 ml/cm$^2$, followed by spin coating for 10 seconds. The substrate was heat treated on a hot plate at a temperature of 100° C. for 10 minutes to form a hole transport layer.

On the hole transport layer, the MAPbBr$_3$ precursor solution prepared according to Preparation Method 2 described below was spin-coated at 4000 rpm for 10 seconds while being added dropwise. Then, diethyl ether was added dropwise in an amount of 0.5 ml/cm$^2$, followed by spin coating for 10 seconds. The substrate was heat treated on a hot plate at a temperature of 100° C. for 10 minutes to form an emission layer.

An electron transport layer having a thickness of 35 nm was formed by vacuum thermal deposition of TPBI on the emission layer.

LiQ was vacuum-thermal-deposited on the electron transport layer to form an electron injection layer having a thickness of 100 nm, and Al was vacuum-thermal-deposited thereon to form a cathode having a thickness of 100 nm.

Figure 5A:
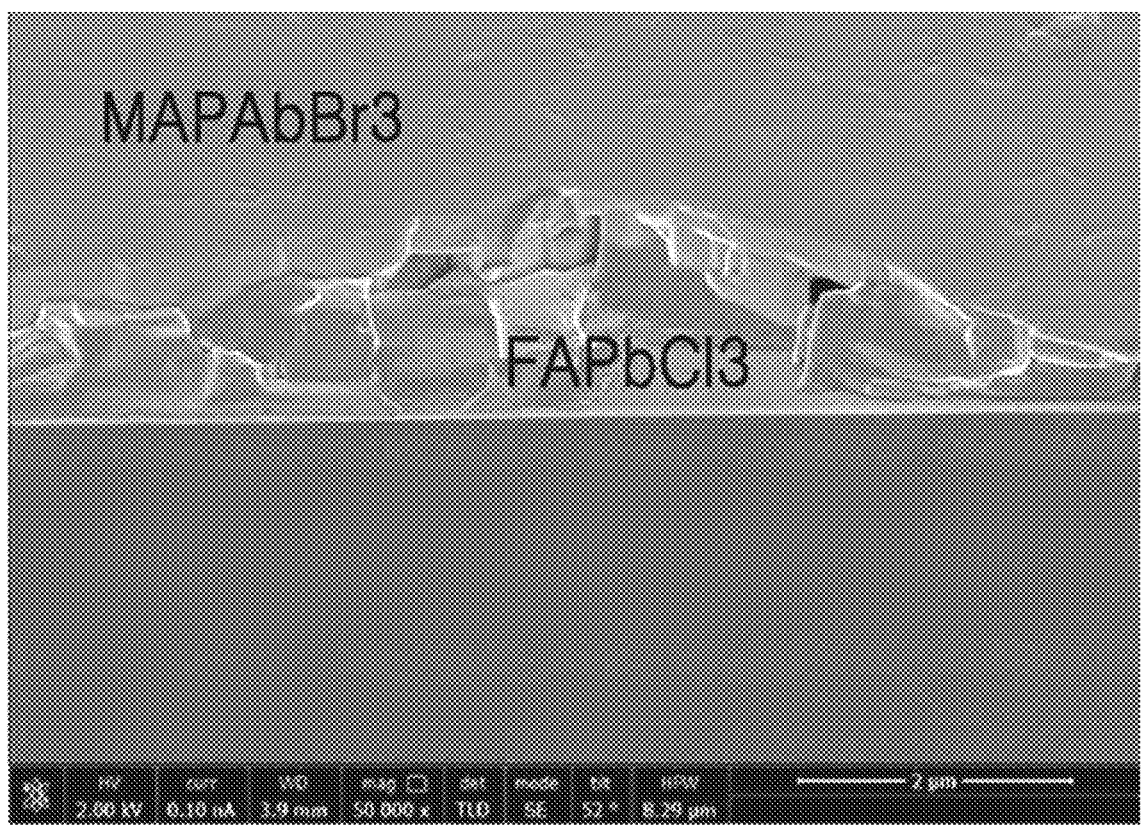
FIGS. 5A and 5B are transmission electron microscope (TEM) images of a cross-section of the light-emitting device of Example 1.
Figure 5B:
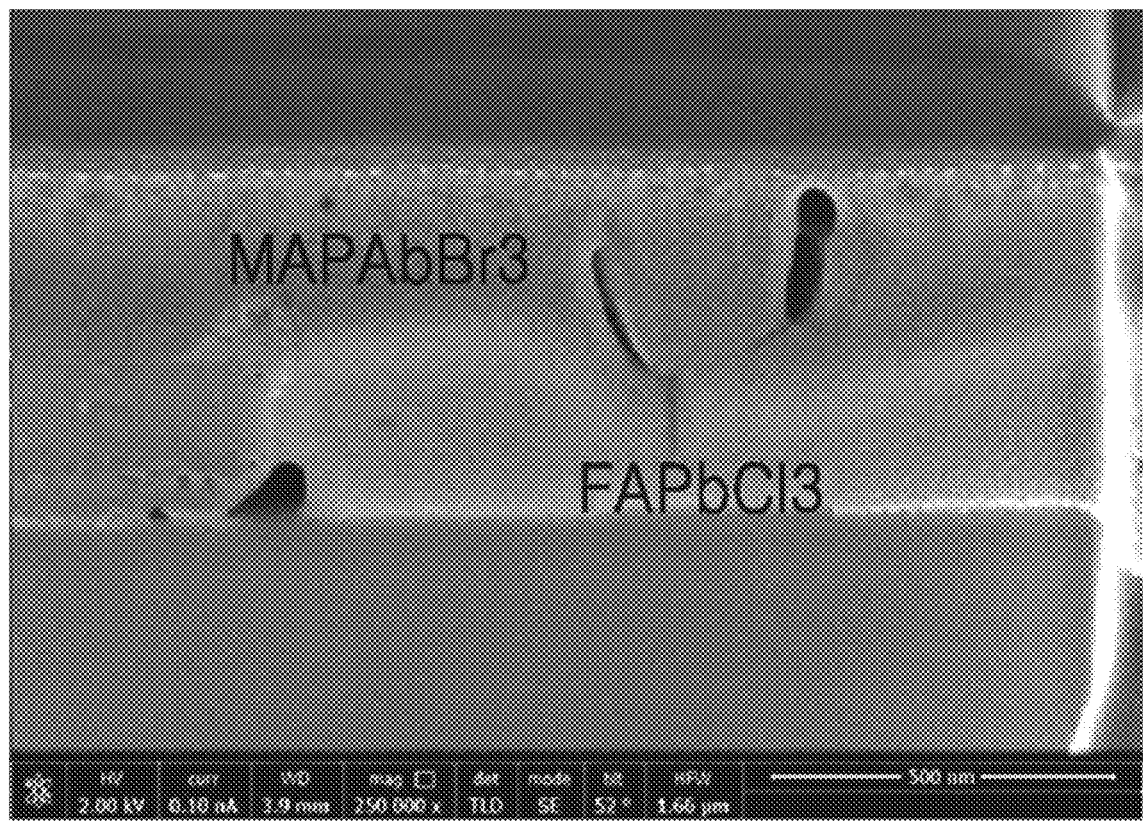

FIGS. 5A and 5B are transmission electron microscope (TEM) images of a cross-section of the light-emitting device of Example 1. FIG. 5A is a TEM image of a cross-section of the light-emitting device of Example 1 formed by breaking the light-emitting device with an external force. FIG. 5B is a TEM image of a cross section of the light-emitting device of Example 1 formed by cutting the light-emitting device with a laser.

Preparation Method 1

PbCl$_2$ (1 mmol) was dissolved in 1 g of hexamethyl phosphor amide (HMPA) at a temperature of 60° C. Then, FACl (1.5 mmol), 0.4 g of DMSO, and 1.6 g of DMF were added thereto at a temperature of 60° C. to prepare a FAPbCl$_3$ precursor solution.

Preparation Method 2

PbBr$_2$ (1 mmol), MABr (1 mmol), DMSO (2 g), and DMF (6.5 g) were mixed in a sealed container and dissolved in an oven by heating at the temperature of 60° C.

Evaluation Example 2

Figure 6:
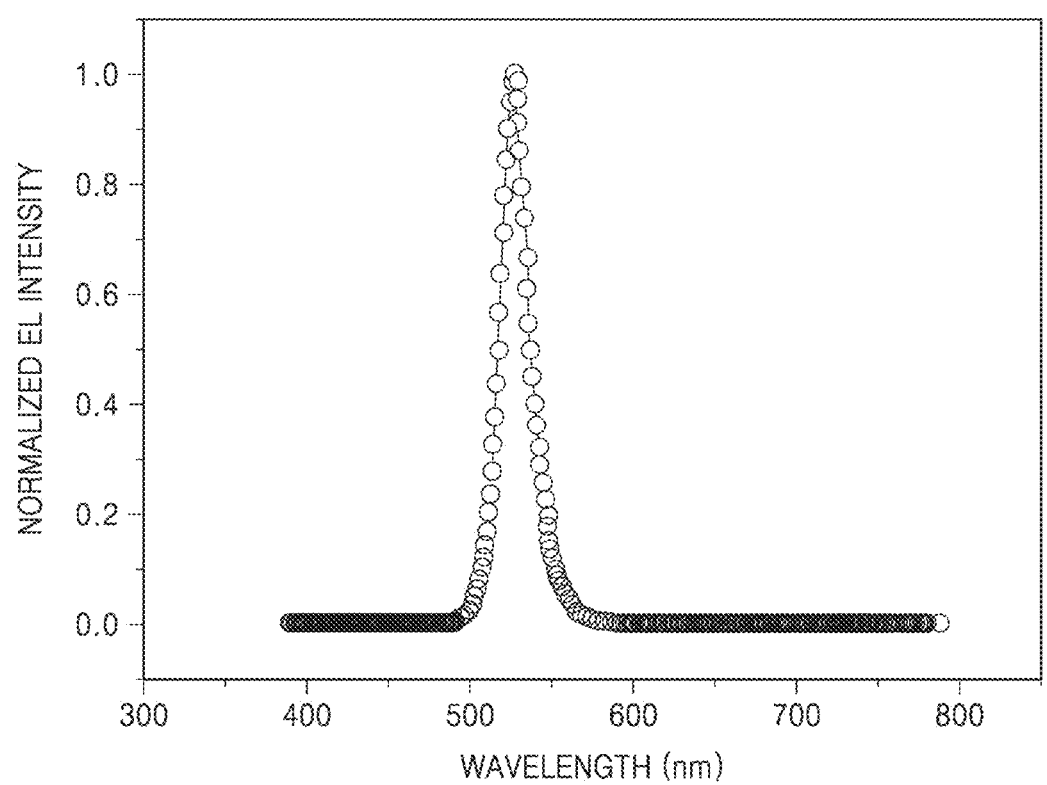
FIG. 6 is a graph of normalized intensity versus wavelength (nm) and shows an electroluminescence (EL) spectrum of the light-emitting device of Example 1.
Figure 7:
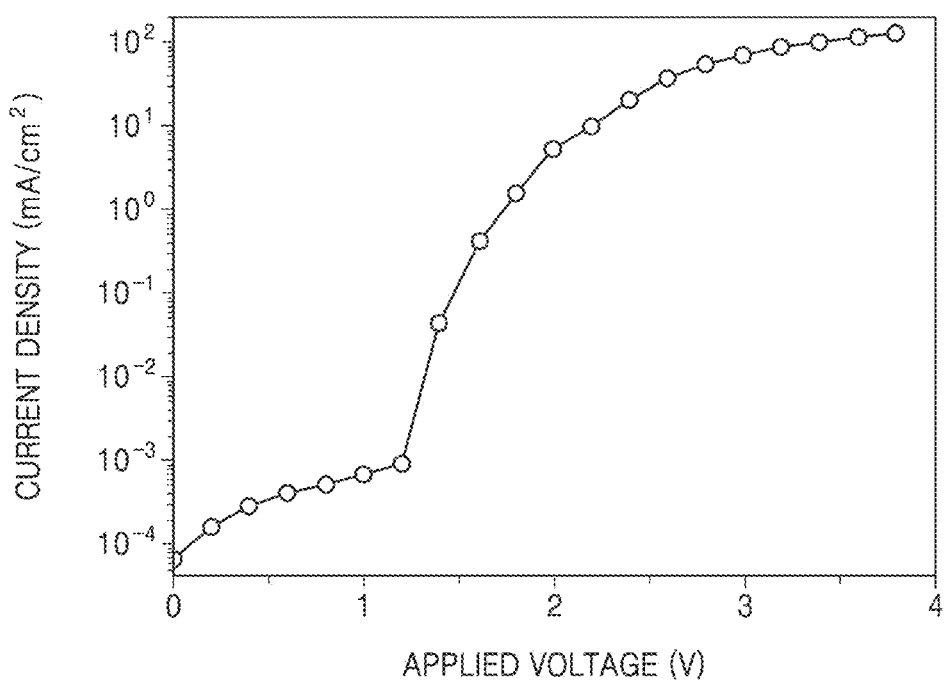
FIG. 7 is a graph of current density (milliamperes per square centimeter, $mA/cm^2$) versus applied voltage (volt, V) for the light-emitting device of Example 1.
Figure 8:
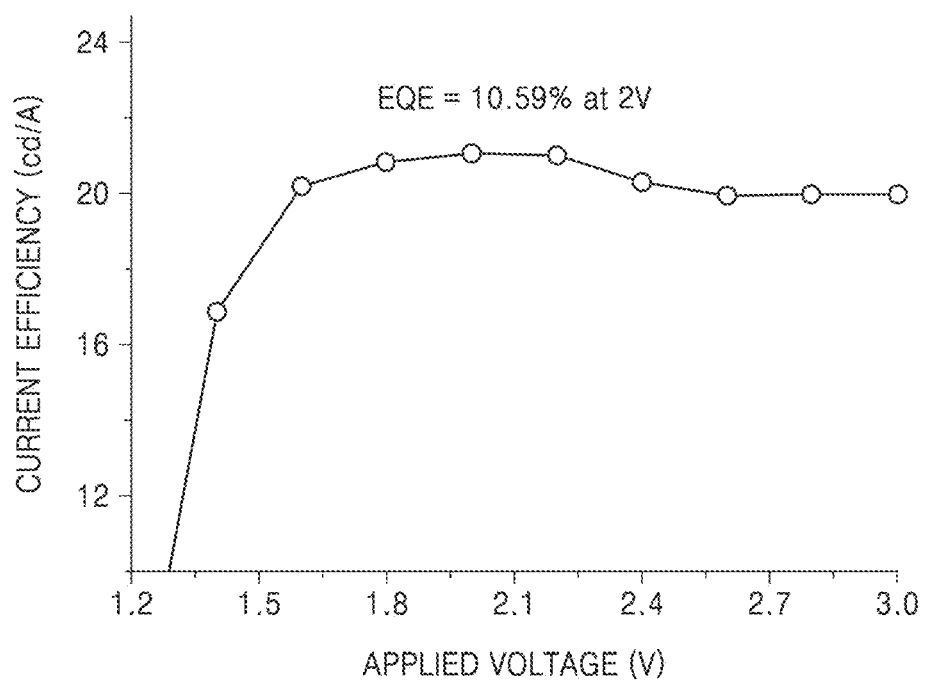
FIG. 8 is a graph of current efficiency (candela per ampere, cd/A) versus applied voltage (V) and shows a graph of voltage versus current efficiency of the light-emitting device of Example 1.

Regarding the light-emitting device of Example 1, the driving voltage, current efficiency, lifespan (LT50, LT95), maximum external quantum efficiency (Max EQE), maximum luminance and maximum luminescence wavelength ($\lambda_{max}$) were evaluated by using the current-voltmeter (Keithley 2400) and the luminance meter (Minolta Cs-1000 A), and results thereof are shown in Table 1 and FIGS. 6 to 8. At this time, the driving voltage values were 2.00 V and 3.00 V, and the results are shown in Table 1. FIGS. 6 to 8 show values at the driving voltage of 2.00 V. In addition, LT50 is the time in the case in which the luminance reaches 50% of the initial luminance at 650 candela (cd), and LT95 is the time in the case in which the luminance reaches 95% of the initial luminance at 650 cd.

TABLE 1

| No. | Driving voltage (V) | Current efficiency (cd/A) | LT50 (hr) | LT95 (hr) | Max EQE (%) | Maximum luminance (cd/m²) | $\lambda_{max}$ (nm) |
|---|---|---|---|---|---|---|---|
| 1 | 2.00 | 22.3 | 300 | 25 | 10.59 | 5273 | 528 |
| 2 | 3.00 | 19.8 | 310 | 18 | 9.60 | 18456 | 528 |

In the light-emitting device, since each of the emission layer and the charge transport layer include a perovskite compound, chemical bonds at the interface between the emission layer and the charge transport layer can be strengthened. Accordingly, defects of the interface and/or traps are reduced, thereby providing a light-emitting device with improved efficiency and/or lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first electrode;
a second electrode facing the first electrode;
an emission layer disposed between the first electrode and the second electrode; and
a first charge transport layer disposed between the first electrode and the emission layer,
a second charge transport layer disposed between the emission layer and the second electrode,
wherein a band gap energy of the emission layer and a band gap energy of the first charge transport layer are different from each other,
wherein the band gap energy of the emission layer and a band gap energy of the second charge transport layer are different from each other,
the emission layer comprises a first perovskite compound, wherein the first perovskite compound and the second perovskite compound are different from each other; and
the first charge transport layer comprises a second perovskite compound,
wherein the band gap energy of the emission layer is less than the band gap energy of the first charge transport layer.

2. The light-emitting device of claim 1, wherein the first charge transport layer does not contain an organic compound or a metal oxide.

3. The light-emitting device of claim 1, wherein the first perovskite compound and the second perovskite compound are different from each other.

4. The light-emitting device of claim 1, wherein the emission layer is in direct contact with the first charge transport layer.

5. The light-emitting device of claim 1, wherein the first perovskite compound is represented by Formula 1, and the second perovskite compound is represented by Formula 2:

[A¹][B¹][X¹]₃      Formula 1

[A²][B²][X²]₃      Formula 2 wherein, in Formulae 1 and 2,
$A^1$ and $A^2$ are each independently a monovalent organic cation, a monovalent inorganic cation, or a combination thereof,
$B^1$ and $B^2$ are each independently a divalent metal cation, a divalent metalloid cation, or a combination thereof, and
$X^1$ and $X^2$ are each independently at least one monovalent halogen ion.

6. The organic light-emitting device of claim 5, wherein $A^1$ and $A^2$ are each independently an ammonium ion, an alkylammonium ion, an arylammonium ion, an arylalkylammonium ion, a formamidinium ion, an alkylamidinium ion, arylamidinium ion, arylalkylamidinium ion, an alkali metal ion, or a combination thereof,
$B^1$ and $B^2$ are each independently $Pb^{2+}$, $Sn^{2+}$, $Bi^{2+}$, $Sb^{2+}$, $Cu^{2+}$, $Ag^{2+}$, $Au^{2+}$, $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof, and
$X^1$ and $X^2$ are each independently $Cl^-$, $Br^-$, $I^-$, or a combination thereof.

7. The light-emitting device of claim 5, wherein $A^1$ and $A^2$ are each independently a methylammonium ion, a formamidinium ion, $Cs^+$, or a combination thereof,
$B^1$ and $B^2$ are each independently $Pb^{2+}$, and
$X^1$ and $X^2$ are each independently $Cl^-$, $Br^-$, or a combination thereof.

8. The light-emitting device of claim 1, wherein the first electrode is an anode, the second electrode is a cathode, and the first charge transport layer is a hole transport layer; or
the first electrode is a cathode, the second electrode is an anode, and the first charge transport layer is an electron transport layer.

9. The light-emitting device of claim 1, further comprising a second charge transport layer disposed between the emission layer and the second electrode,
wherein the band gap energy of the emission layer and a band gap energy of the second charge transport layer are different from each other.

10. The light-emitting device of claim 9, wherein the second charge transport layer does not contain an organic compound or a metal oxide.

11. The light-emitting device of claim 9, wherein the emission layer is in direct contact with the second charge transport layer.

12. The light-emitting device of claim 9, wherein the band gap energy of the emission layer is less than the band gap energy of the second charge transport layer.

13. The light-emitting device of claim 9, wherein the second charge transport layer comprises a third perovskite compound.

14. The light-emitting device of claim 13, wherein the second charge transport layer consists of the third perovskite compound.

15. The light-emitting device of claim 13, wherein the first perovskite compound and the third perovskite compound are different from each other.

16. The light-emitting device of claim 13, wherein the third perovskite compound is represented by Formula 3:

$$[A^3][B^3][X^3]_3 \qquad \text{Formula 3}$$

wherein, in Formula 3,
- $A^3$ is a monovalent organic cation, a monovalent inorganic cation, or a combination thereof,
- $B^3$ is a divalent metal cation, a divalent metalloid cation, or a combination thereof, and
- $X^3$ is at least one monovalent halogen ion.

17. The light-emitting device of claim 9, wherein the first electrode is an anode, the second electrode is a cathode, the first charge transport layer is a hole transport layer, and the second charge transport layer is an electron transport layer; or
the first electrode is a cathode, the second electrode is an anode, the first charge transport layer is an electron transport layer, and the second charge transport layer is a hole transport layer.

18. A light-emitting device comprising:
a first electrode;
a second electrode facing the first electrode; and
n light-emitting units disposed between the first electrode and the second electrode,
wherein n is a natural number of 2 or greater,
an $n^{th}$ light-emitting unit among the n light-emitting units comprises an $n^{th}$ emission layer, an $n^{th}$ first charge transport layer, and $n^{th}$ second charge transport layer,
wherein a band gap energy of the $n^{th}$ emission layer is different from a band gap energy of the $n^{th}$ first charge transport layer, and a band gap energy of the $n^{th}$ emission layer is different from a band gap energy of the $n^{th}$ second charge transport layer,
an $n-1^{th}$ light-emitting unit among the light-emitting units comprises an $n-1^{th}$ emission layer, an $n-1^{th}$ first charge transport layer, and an $n-1^{th}$ second charge transport layer, wherein a band gap energy of the $n-1^{th}$ emission layer is different from a band gap energy of the $n-1^{th}$ first charge transport layer, and a band gap energy of the $n-1^{th}$ emission layer is different from a band gap energy of the $n-1^{th}$ second charge transport layer,
the $n-1^{th}$ first charge transport layer is disposed between the $n^{th}$ emission layer and the $n-1^{th}$ emission layer,
the $n-1^{th}$ second charge transport layer is disposed between the $n^{th}$ emission layer and the $n-1^{th}$ emission layer,
each of the $n^{th}$ emission layer and the $n-1^{th}$ emission layer independently comprises a first perovskite compound, wherein the first perovskite compound and the second perovskite compound are different from each other, and
each of the $n^{th}$ first charge transport layer and the $n-1^{th}$ first charge transport layer independently consists of a second perovskite compound.

19. The light-emitting device of claim 18, wherein the $n^{th}$ emission layer is in direct contact with the $n^{th}$ first charge transport layer,
the $n-1^{th}$ emission layer is in direct contact with the $n-1^{th}$ first charge transport layer, and
the $n-1^{th}$ emission layer is in direct contact with the $n^{th}$ first charge transport layer.

* * * * *